United States Patent [19]
Kamikawa

[11] Patent Number: 5,213,118
[45] Date of Patent: May 25, 1993

[54] TREATMENT APPARATUS

[75] Inventor: Yuji Kamikawa, Uto, Japan

[73] Assignees: Tokyo Electron Limited, Tokyo; Tokyo Electron Kyushu Limited, Kumamoto, both of Japan

[21] Appl. No.: 791,137

[22] Filed: Nov. 13, 1991

[30] Foreign Application Priority Data

Nov. 28, 1990 [JP] Japan .................................. 2-331311

[51] Int. Cl.⁵ .............................................. B08B 3/04
[52] U.S. Cl. ........................................ 134/62; 134/66; 134/902
[58] Field of Search .................. 134/902, 62, 66, 76

[56] References Cited

U.S. PATENT DOCUMENTS

| | | | |
|---|---|---|---|
| 2,730,068 | 1/1956 | Reynolds et al. | 134/66 X |
| 4,062,437 | 12/1977 | Knapp | 134/79 X |
| 4,282,825 | 8/1981 | Nagatomo et al. | 134/902 X |
| 4,736,758 | 4/1988 | Kusuhara | 134/902 X |
| 4,899,768 | 2/1990 | Yatabe | 134/902 X |
| 4,924,890 | 5/1990 | Giles et al. | 134/902 X |
| 4,985,722 | 1/1991 | Ushijima et al. | 134/902 X |
| 5,081,733 | 1/1992 | Kudo | 134/902 X |

FOREIGN PATENT DOCUMENTS 5530   1/1985   Japan .................................. 134/66

Primary Examiner—Philip R. Coe
Attorney, Agent, or Firm—Oblon, Spivak, McClelland, Maier & Neustadt

[57] ABSTRACT

A washing apparatus comprises a loader, unloader, and three washing units (i.e., a carry-in side unit, a carry-out side unit, and an intermediate unit) arranged between the loader and unloader. Each unit has two washing sections for performing batch treatment of wafers, and a rotary transfer arm. An underwater loader is provided between each pair of adjacent washing units. Each of the washing sections and underwater loaders has a vessel and a case housing the vessel. The case is provided with a shutter and an air curtain at an opening thereof for isolating the atmosphere therein from the outside thereof. The loader, unloader, washing sections, and underwater loaders are located around the rotational axis of the rotary transfer arm such that each adjacent two are arranged substantially at right angles to each other, which enables the device to be made compact and to have high treatment efficiency.

25 Claims, 11 Drawing Sheets

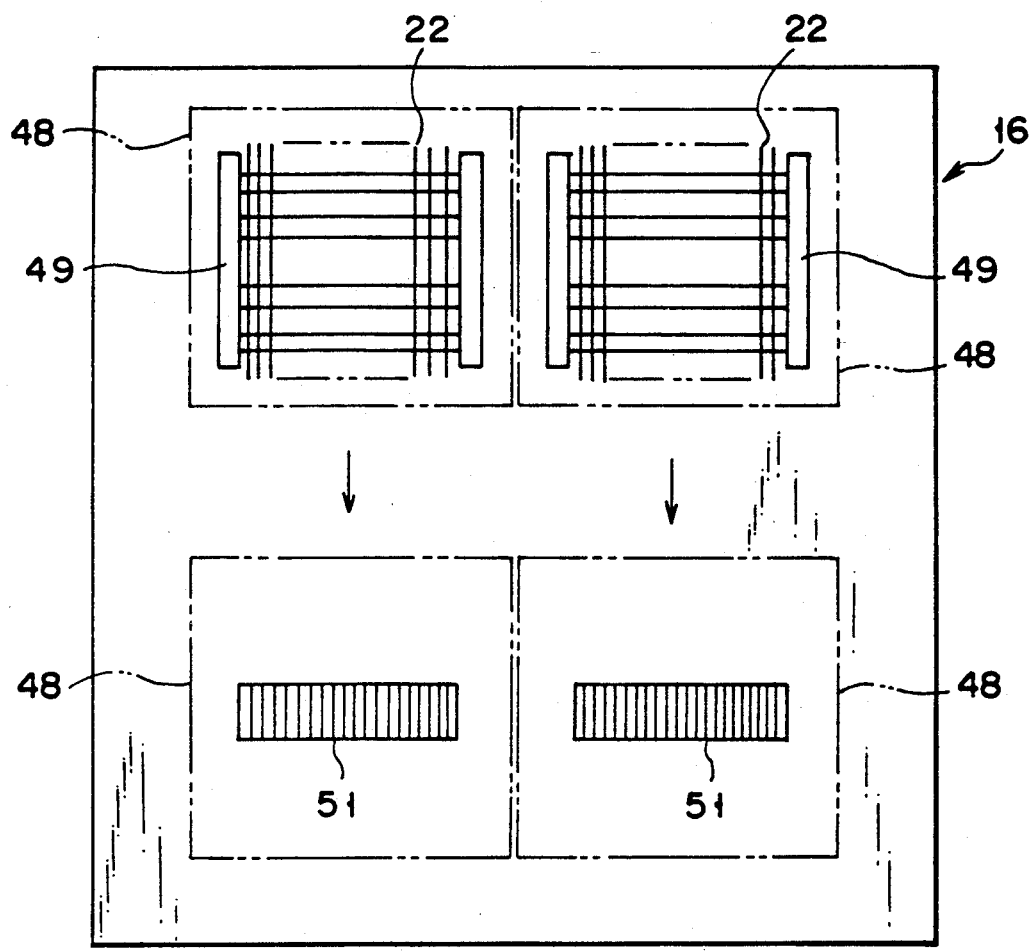
F I G. 2

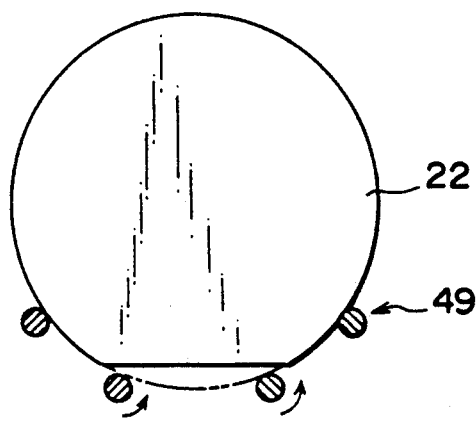
F I G. 3
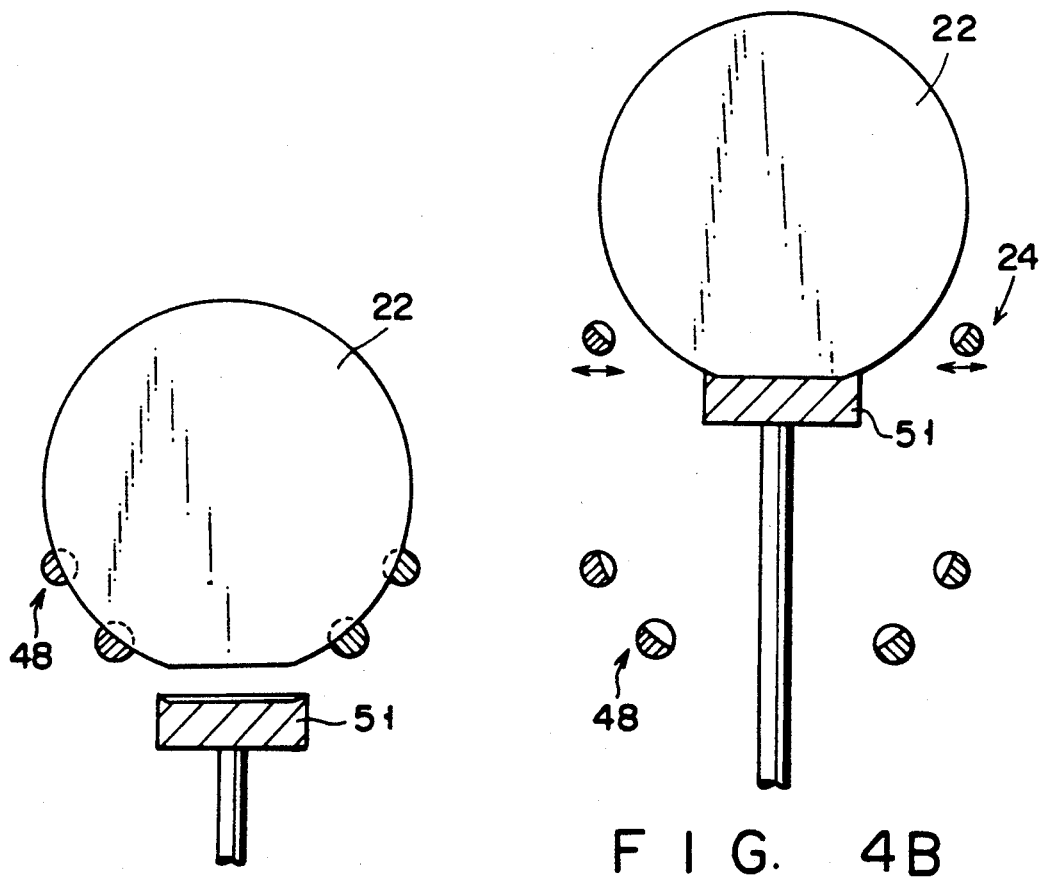
F I G. 4A
F I G. 4B

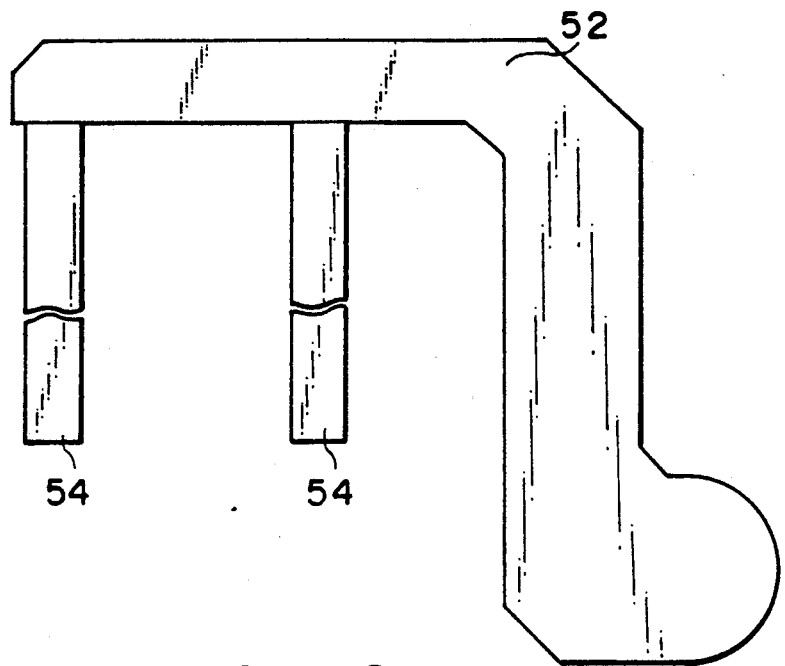
FIG. 8A
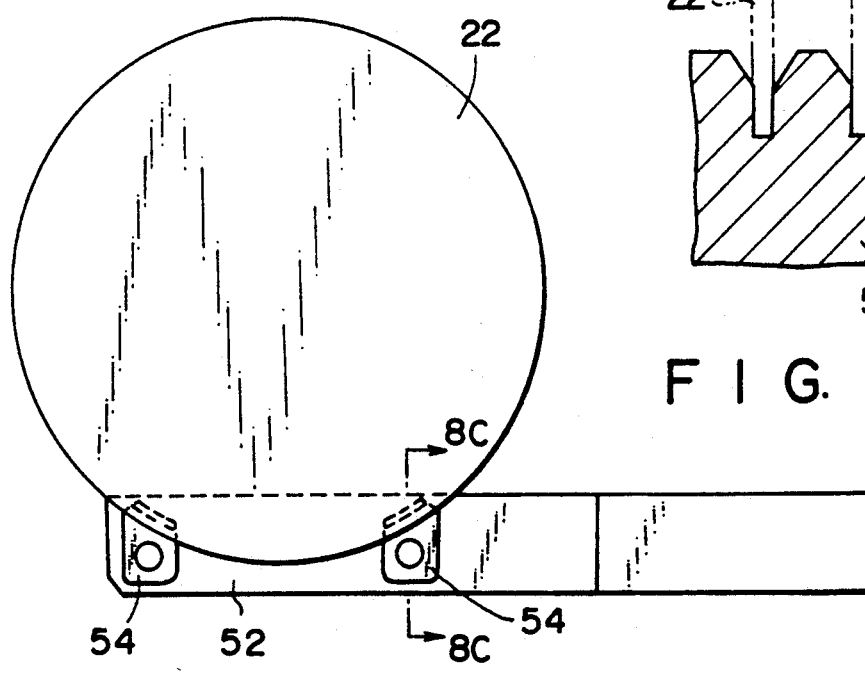
FIG. 8C
FIG. 8B

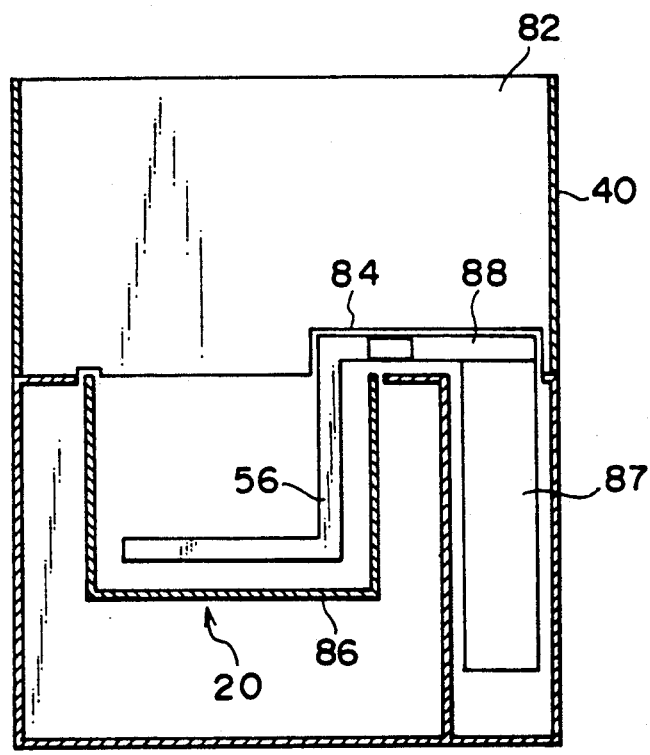
F I G. 12

TREATMENT APPARATUS

BACKGROUND OF THE INVENTION

1. Field of the Invention

This invention relates to a treatment apparatus employing a plurality of washing units for washing semiconductor wafers on a continuous basis.

2. Description of the Related Art

A wafer washing apparatus employed in a semiconductor wafer manufacturing system, for example, is used as a treatment apparatus having a plurality of treatment units for continuously treating objects.

In the washing apparatus, semiconductor wafers are subjected to ammonia treatment, water rinse treatment, hydrofluoric acid treatment, etc., on a continuous basis.

To perform such treatments, a conventional washing apparatus is constructed such that a plurality of treatment vessels for respectively performing the treatments are arranged in a row, and that semiconductor wafers to be treated are transferred to the vessels by means of a transfer device movable along the vessels.

Arranging the vessels in a row inevitably requires a large elongated space, and requires the transfer unit to move a long distance.

Further, to transfer the wafers between adjacent ones of the vessels the conventional washing apparatus is equipped with a plurality of linear transfer units each arranged between adjacent vessels, and driving units for driving the transfer units, respectively. Provision of a plurality of driving units may lower the energy efficiency, and cause dust. The dust may lower the yield of products, in particular, in the case of manufacturing semiconductor wafers. If, on the other hand, a common transfer unit is used in place of a plurality of transfer units, then the throughput will inevitably be lowered.

SUMMARY OF THE INVENTION

It is the object of the invention to provide a treatment apparatus which employs a plurality of treatment units arranged in a small space, and has a high treatment efficiency as a result of avoiding waste in moving the transfer device employed therein.

The treatment apparatus of the invention has a plurality of treatment units for performing batch treatments, and treats a plurality of wafer-like objects in the treatment units while transferring the objects to the units on a continuous basis. This apparatus comprises:

(a) a loader for supplying objects to be treated;

(b) a first treatment unit for receiving the objects from the loader, the first treatment unit having a first arm having first handling means for receiving and supplying the objects, means for rotating the first arm in a horizontal direction, and first and second treatment sections, the loader, and first and second treatment sections being arranged in a line in which the first handling means rotates, and the objects being transferred between the loader, and first and second treatment sections by means of the first arm;

(c) an unloader for receiving the objects having been treated;

(d) a second treatment unit for transferring the objects to the unloader, the second treatment unit having a second arm having second handling means for receiving and supplying the objects, means for rotating the second arm in a horizontal direction, and third and fourth treatment sections, the unloader, and third and fourth treatment sections being arranged in a line in which the second handling means rotates, and the objects being transferred between the unloader, and third and fourth treatment sections by means of the second arm; and (e) a transit section arranged between the first and second treatment units, the transit section having an inlet arranged in the line in which the first handling means rotates, and permitting the objects to be transferred by the first arm, and an outlet arranged in the line in which the second handling means rotates, and permitting the objects to be transferred by the second arm.

According to the invention, the apparatus requires a space of a small longitudinal distance, i.e., its required space is reduced as compared with the conventional apparatus. Further, since a rotary transfer arm is provided for the treatment sections of each washing unit, and its movement is reduced to a minimum value, the treatment efficiency of the apparatus is enhanced. The number of driving devices to be employed is reduced by use of the common rotary transfer arm, thereby saving power without reducing the throughput. In addition, if the treatment sections are integrated into units, these units can be combined in a desired manner, and hence can easily be applied to various types of treatment apparatuses. That is, the units can be used as general purpose units.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a plan view, showing a loader employed in the apparatus of FIG. 1;

FIG. 3 is a sectional view, showing an orientation flat aligning mechanism employed in the loader of FIG. 2;

FIGS. 4A and 4B are sectional views, showing operation of a pushing bar employed in the mechanism of FIG. 3;

FIG. 8A is a plan view of a wafer fork, FIG. 8B is a side view of the fork, and FIG. 8C is a sectional view, taken along line 8C—8C in FIG. 8B;

FIG. 12 is a sectional view, showing the relationship between the underwater loader and a partition plate.

DETAILED DESCRIPTION OF THE PREFERRED EMBODIMENTS

A washing apparatus according to the invention will be explained in detail with reference to the accompanying drawings showing an embodiment in which the washing apparatus is employed in a semiconductor wafer manufacturing system.

Figure 1:
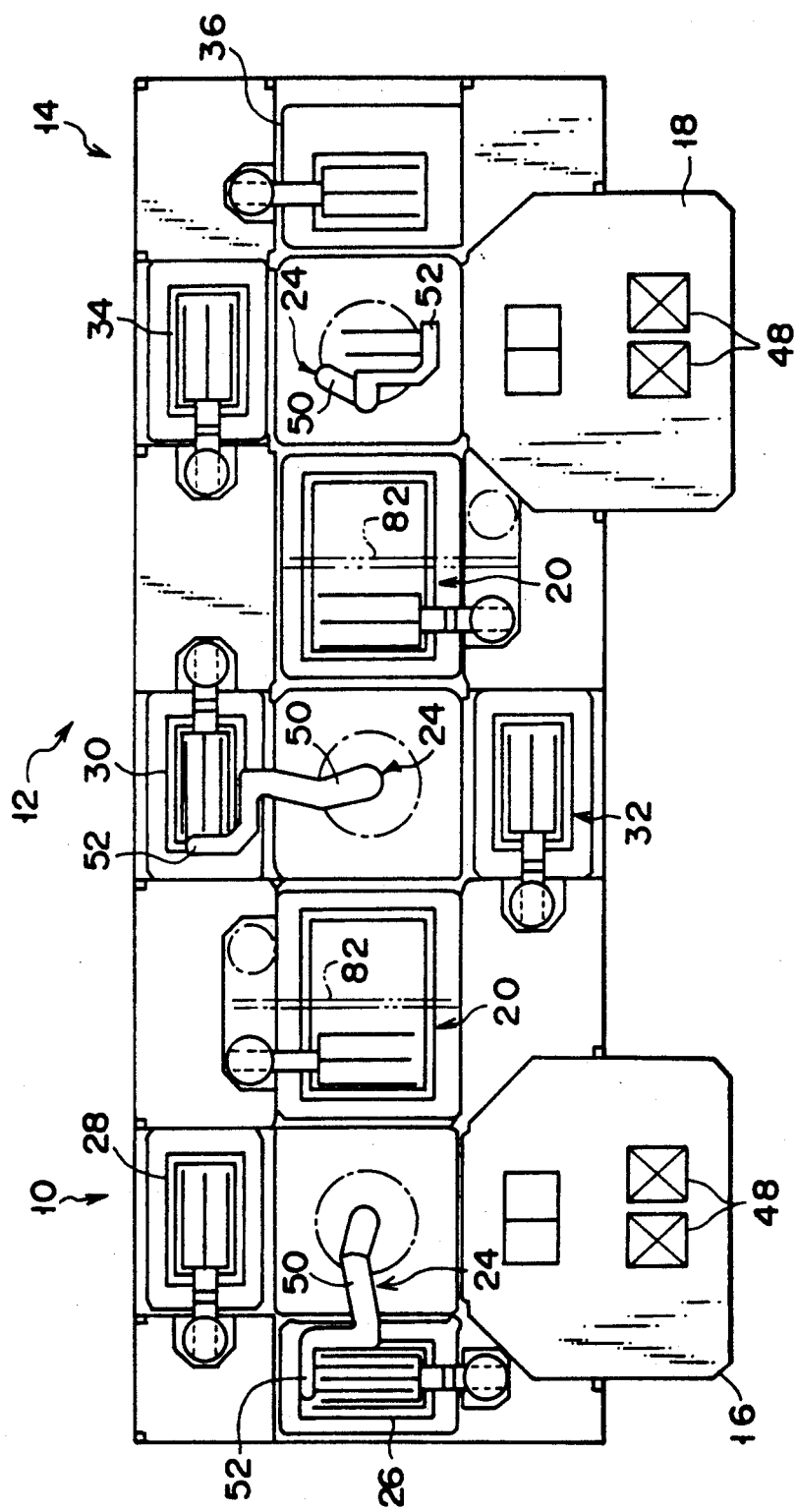
FIG. 1 is a plan view, showing the entire arrangement of a washing apparatus according to a first embodiment of the invention.

As is shown in FIG. 1, the washing apparatus of the embodiment comprises three washing units 10, 12, and 14. The unit 10 arranged on the wafer carry-in side is connected to a loader 16 for loading wafers to be treated. The unit 14 arranged on the wafer carry-out side is connected to an unloader 18 for unloading wafers having been processed. Underwater loaders 20 are provided between the units 10 and 12 and between the units 12 and 14. This arrangement may be changed. In this embodiment, the arrangement is determined to accord to a predetermined washing program.

The washing unit 10 has a rotary transfer arm 24 arranged in the center thereof for transferring a semiconductor wafer 22, and washing vessels 26 and 28 arranged on the left side of the arm 24 and in front of the loader 16, respectively. In the embodiment, the vessel 26 is used as a chemical processing vessel for performing ammonia treatment, while the vessel 28 is used as a quick damp rinse (QDR) vessel for performing water rinse treatment.

In the central washing unit 12, the underwater loaders 20 are arranged on the both opposite sides of the rotary transfer arm 24 located in the center of the central washing unit 12, and washing vessels 30 and 32 are arranged in front of the arm 24 and in rear of the same, respectively. The vessel 30 is used as a chemical vessel for performing hydrofluoric acid treatment, while the vessel 32 is used as water overflow treatment vessel.

The washing unit 14 has a rotary transfer arm 24 arranged in the center thereof, and a washing vessel 34 and a drying vessel 36 arranged on the right side of the arm 24 and in front of the loader 18, respectively. In the embodiment, the vessel 34 is used as final water rinse treatment vessel.

Figure 6:
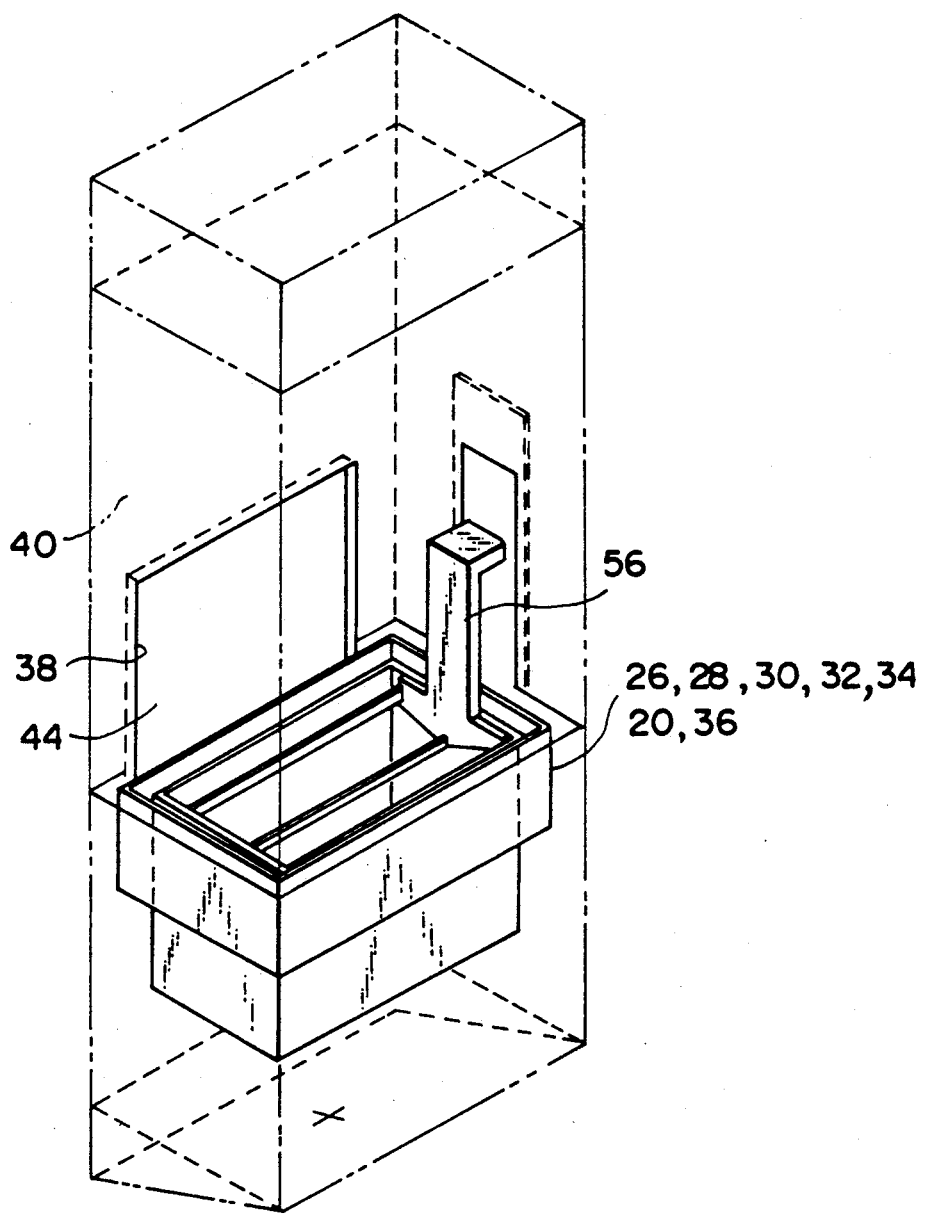
FIG. 6 is a sectional view, showing washing vessels, an underwater loader, and a drying vessel, which are employed in the device of FIG. 1.
Figure 10:
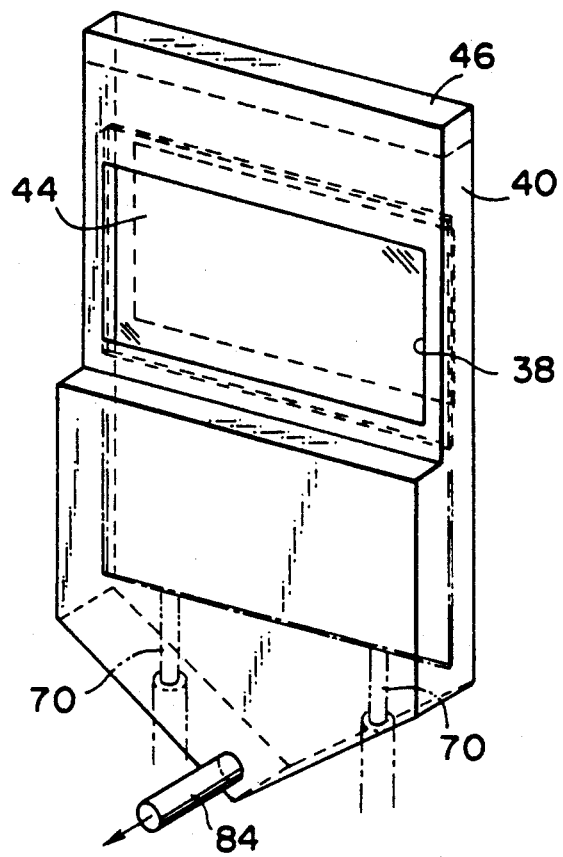
FIG. 10 is a perspective view, showing a shutter and an air curtain.
Figure 11:
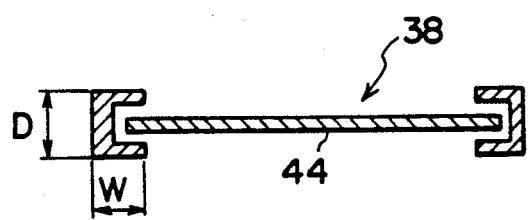
FIG. 11 is a cross-sectional view of an opening formed in the shutter of FIG. 10.

As is shown in FIGS. 6 and 10, each of the vessels 26, 28, 30, 32, and 34, underwater loaders 20, and drying vessel 36 is received in a case 40 having an opening 38 for carrying in and out the semiconductor wafer 22 (in the case of the underwater loaders 20, openings 38 are formed in the both opposite sides of each loader). A shutter 44 to be moved up and down by means of two cylinders 42 is provided for opening and closing the opening 38. An air blow port 46 is provided in that portion of the case 40 which is located upward of the shutter 44. The atmosphere in the case 40 is shut out from the outside by means of the shutter 44 and an air curtain supplied through the air blow port. In this case, air is exhausted from the lower portion of the case 40 so that pressure therein is controlled to a value slightly lower than the outside atmospheric pressure, thereby preventing the atmosphere therein from leaking to the outside.

As is shown in FIG. 2, the loader 16 performs the following. 50 semiconductor wafers 22 placed on two carriers 48 (i.e., 25 wafers on each carry) are subjected to orientation flat aligning performed by means of an orientation flat aligning mechanism 49 shown in FIG. 3, and then are pushed up by pushing bars 51 shown in FIG. 4. The bars 51 are gathered to each other, where the 50 wafers are received by the rotary transfer arm 24 located on the wafer carry-in side. The unloader 18 has a structure similar to the loader 16, but operates in the order inverse to that in which the loader 16 operates.

Figure 5:
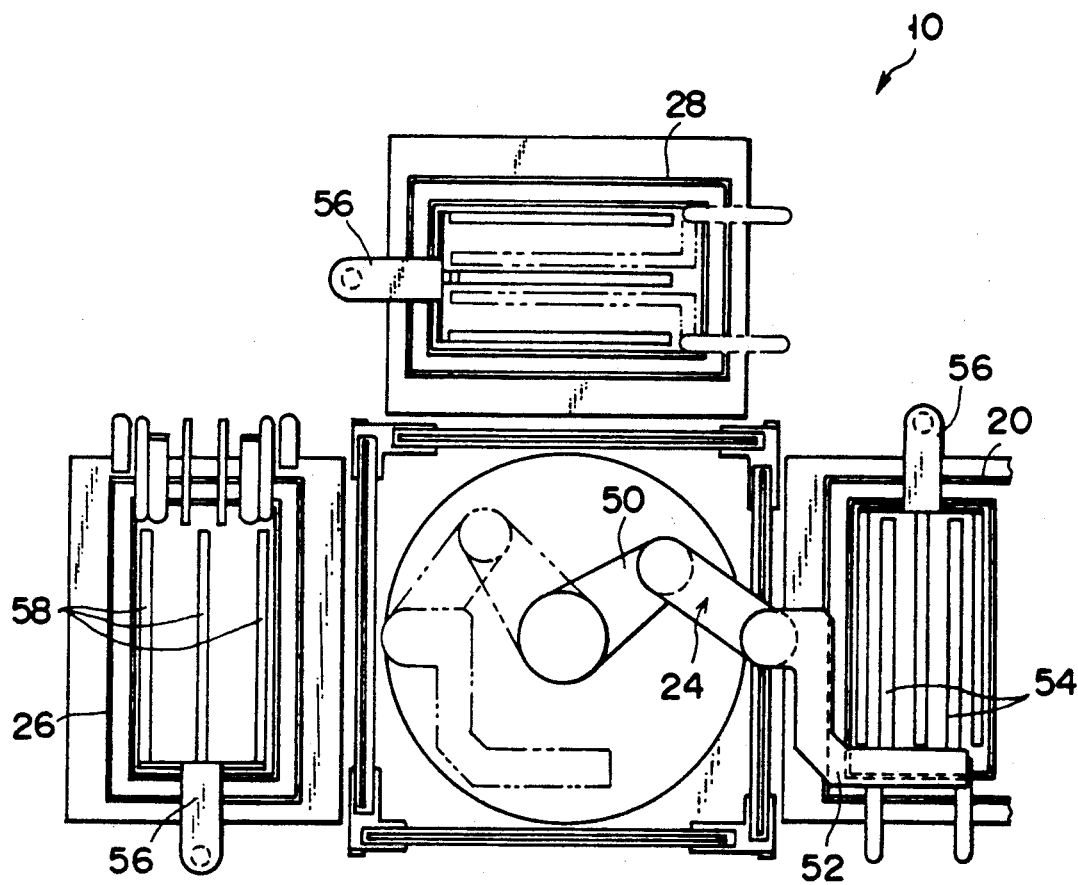
FIG. 5 is an enlarged view, showing a treatment unit arranged on the carry-in side of the device of FIG. 1.

As is shown in FIG. 5, the rotary transfer arm 24 has an arm body 50 having a plurality of joints and being able to expand, contract, and rotate in the horizontal direction. The tip portion of the body 50 is provided with a wafer fork 52 for placing the 50 wafers 22 thereon without the carrier 48. The wafers are transferred from the fork 52 to the loader 16, vessels 26, 28, 30, 32, or 34, underwater loader 20, drying vessel 36, or unloader 18.

Specifically, as is shown in FIGS. 8A to 8C, the fork 52 has two parallel support bars 54 having a plurality of support grooves 62 for positioning the wafers 22, and being movable in the horizontal direction. Between the fork 52 and loader 16 (or unloader 18), the fork 52 receives the wafers 22 from the pushing bars 51 moving up and down between the two support bars 54, and transfers the wafers to the pushing bars 51.

Figure 7:
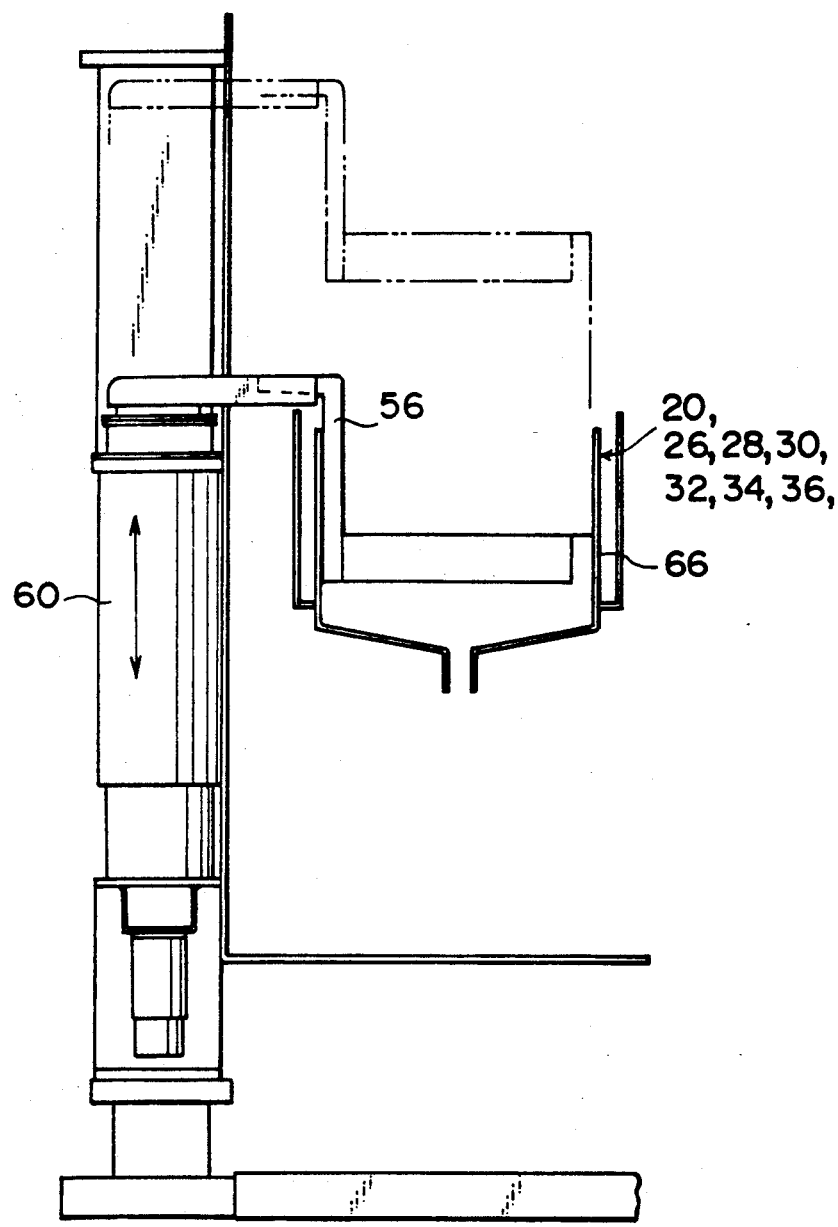
FIG. 7 is a side view, showing an actuator and a boat.

As is shown in FIG. 7, between the fork 52 and underwater loaders 20, washing vessels 26, 28, 30, 32, or 34, or drying vessel 36, the fork 52 receives the wafers 22 from a boat 56 provided for each of the vessels and being movable up and down, and transfers them to the boat 56.

Figure 9A:
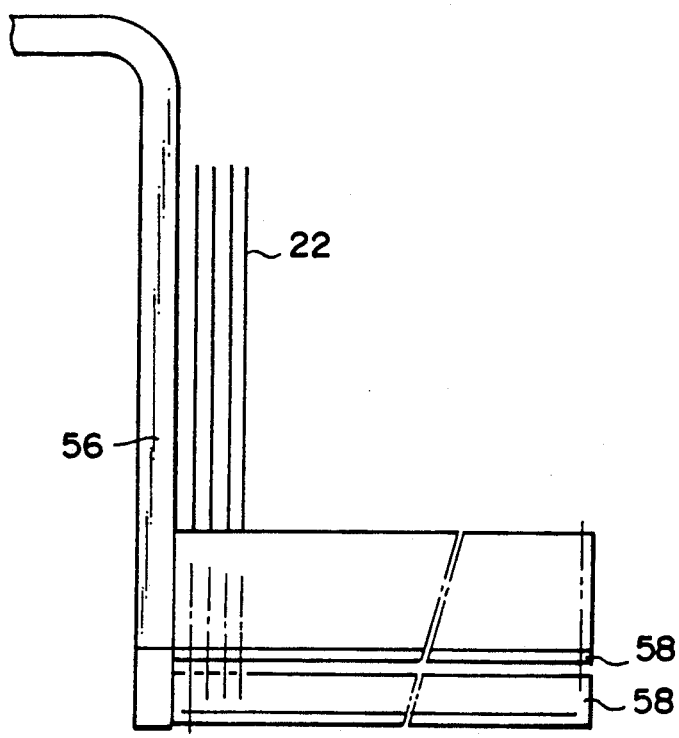
FIG. 9A is a side view of the boat.
Figure 9B:
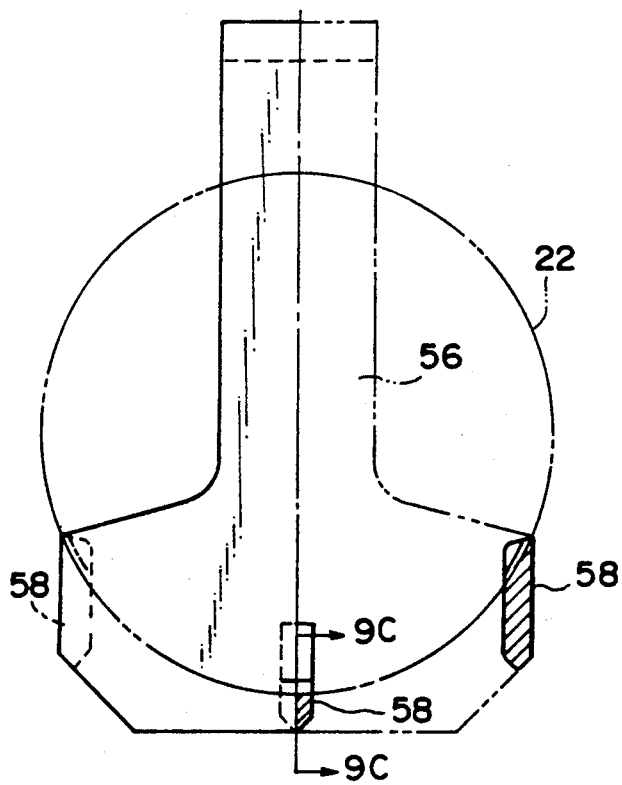
FIG. 9B is a front view of the boat.
Figure 9C:
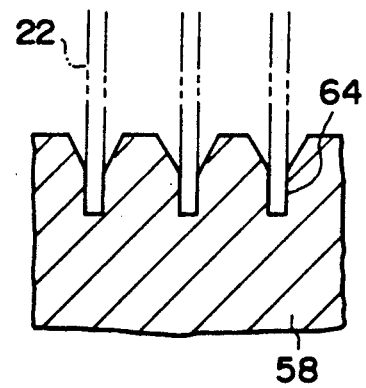
FIG. 9C is a sectional view, taken along line 9C—9C in FIG. 9B.

Each boat 56 has, as shown in FIGS. 9A to 9C, three parallel support bars 58 having a plurality of support grooves 64 for positioning the wafers 22, and can be moved up and down by an actuator 60. The three support bars 58 are arranged so as not to collide with the two support bars 54 of the wafer fork 52 in the up and down directions, and so as to extend along the outline of the wafer 22. The boat 56 does not use the carrier 48 to position the wafers 22. The wafers 22 are placed on the wafer fork 52 of the arm 24, and then the fork 52 is inserted into the vessel through the opening 38. At this time, the actuator 60 is expanded and pushes up the boat 56, whereby the wafers 22 are moved from the fork 52 to the boat 56. On the other hand, where the wafers 22 are placed on the boat 56, the boat 56 is moved up, and then the wafer fork 52 is inserted under the boat 56. The boat 56 is then moved down, thereby moving the wafers 22 to the fork 52.

The actuator 60 supporting the boat 56 may cause dust during its up/down movement, and also may corrode due to a chemical since it is provided in a vessel using the chemical. Thus, the cylinder of the actuator 60 comprises a plurality of layers so as to prevent the dust from leaking to the outside of the cylinder. Further, pressure in the cylinder is kept at a positive value, and atmosphere in a space defined between intermediate and outer layers is exhausted, so as to prevent the chemical, existing in the vessel, from flowing into the actuator 60.

Then, the operation of the invention will be explained.

First, when the two carriers 48 each having 25 semiconductor wafers 22 mounted therein ar transferred to the loader 16, the orientation flat aligning mechanism 49 aligns the wafers 22. Then, the pushing bars 51 push up the wafers, while maintaining the position of the carriers 48 unchanged. Subsequently, the pushing bars 51 move close to each other, thereby positioning 50 wafers 22 at regular intervals.

The rotary transfer arm 24 rotates in the horizontal direction, and extends toward the loader 16, thereby positioning the wafer fork 52 below the pushing bar 51. Then, the pushing bar 51 is moved down, and the wafers 22 are moved onto the wafer fork 52.

Where the wafers 22 are placed on the wafer fork 52, the rotary transfer arm 24 rotates in the horizontal direction, and contracts, thereby inserting the wafers 22 into the washing vessel 26 through the opening 38 formed in the case 40 of the vessel 26. In this state, the boat 56 dedicated to the vessel 26 is moved up by the actuator 60, thereby moving the wafers 22 from the fork 52 onto the boat 56. When the rotary transfer arm 24 is moved out of the case 40 through the opening 38, the shutter 44 closes the opening 38, and the boat 56 is moved down by the actuator 60, thereby immersing the wafers 22 in a washing liquid contained in the vessel 26. At this time, the atmosphere in the vessel 26 is prevented in a reliable manner from leaking to the outside of the vessel 26, since the shutter 44 is provided, together with an air curtain formed by blowing air through the air blow port 46, and since pressure in the case 44 is kept at a negative value.

When washing is finished, the wafers 22 are returned from the boat 56 onto the wafer fork 52 of the rotary transfer arm 24, and are taken out of the case 40. Thereafter, the wafers 22 are forwarded to the next vessel 28. While they are treated in the washing vessel 28 after the transfer is completed, the next 50 wafers 22 are transferred into the vessel 26 by means of the rotary transfer arm 24.

After washing in the washing unit 10 arranged on the carry-in side is finished, the wafers 22 are moved to the boat 56 dedicated to the underwater loader 20 arranged between the unit 10 and the intermediate washing unit 12. Then, the boat 56 is moved in the loader 20, thereby transferring the wafers 22 to the side of the washing unit 12.

In the washing unit 12, the wafers 22 are moved from the underwater loader 20 to the washing vessel 30 by means of the rotary transfer arm 24 dedicated to the unit 12, and are subjected to hydrofluoric acid treatment. Subsequently, the wafers 22 are transferred to the washing vessel 32, and are subjected to water rinse overflow treatment. Then, the wafers 22 are moved to the underwater loader 20 arranged between the unit 12 and the carry-out side washing unit 14, and are transferred thereto.

In the washing unit 14, the wafers 22 are moved from the underwater loader 20 to the washing vessel 34 by means of the rotary transfer arm 24 dedicated to the unit 14, where they are subjected to final water rinse treatment. Then, the wafers 22 are transferred to the drying vessel 36, and they are dried therein. Subsequently, the wafers 22 are transferred to the unloader 18, where they are divided into two groups, are subjected to orientation flat alignment treatment, and thereafter are placed on the two carriers 48.

Since the washing vessels 26, 28, 30, 32, and 34, and drying vessel 36 are provided around the rotary transfer arm 24 as described above, the washing apparatus can be made compact, as compared with the conventional washing apparatus having washing vessels arranged in a row.

Further, since the rotary transfer arm 24 is used as the transfer mechanism for transferring the wafers 22, the wafers 22 can be transferred more effectively than in the case of employing the conventional transfer mechanism to be moved linearly.

In the above-described first embodiment, the shutter 44 and air curtain are provided at the opening 38 of the case 40 of each of the underwater loaders 20, thereby isolating the atmospheres in the washing units 10, 12, and 14 from one another. However, the embodiment may be varied such that a partition wall 82 is provided in the case 40 of each loader 20 in place of the shutter 44 and air curtain, as is indicated by the two-dot chain line in FIG. 1.

FIG. 12 shows the detail of the partition wall 82. The wall 82 is provided between the both opposite end walls of the case 40 above the vessel 86 of the underwater loader 20, such that it divides the interior of the case 40 into two portions. A cut-out portion 84 is formed in the partition wall 82 at a location at which the arm 88 of the driving unit 87 of the loader 20 is to be engaged with the boat 56, so as not to interrupt operation of the arm 88.

Although the underwater loader 20 is used in the above embodiment, another transit unit such as the washing vessel 28 may be provided at the position where the two rotary transfer arms 24 on both sides thereof can reach, in stead of the loader 20.

Moreover, the three units 10, 12, and 14 are used in the above embodiment, the number of washing units employed may be varied. If the vessels arranged in a plane are integrated into one unit as shown in the above embodiment, any number of vessels required by semiconductor manufacturers can be provided with ease.

Figure 13:
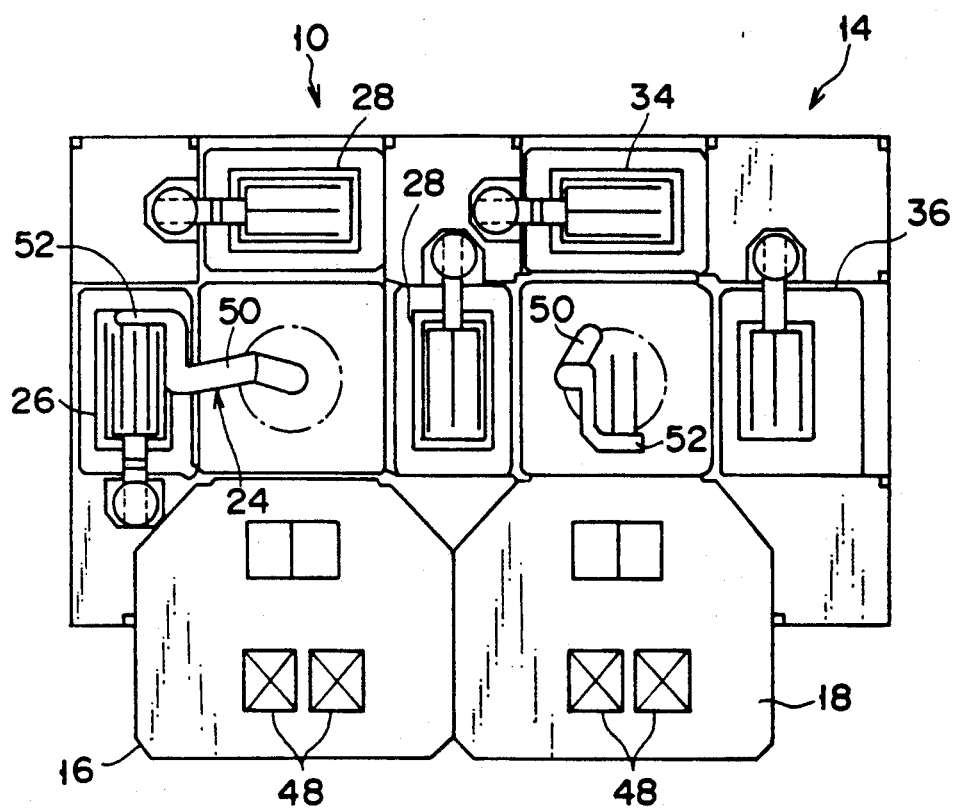
FIG. 13 is a plan view, showing the entire arrangement of a washing device according to a second embodiment of the invention.

FIG. 13 shows a washing apparatus according to a second embodiment, in which elements corresponding to those shown in FIG. 1 are denoted by reference numerals used to denote the corresponding ones, and therefore explanation thereof are omitted.

In this embodiment, only two washing units 10 and 14 arranged on the carry-in and carry-out sides, respectively, are used. A vessel 28 for performing water rinse treatment, which serves as transit unit, is provided between the units 10 and 14. The case 40 of the vessel 28 has openings formed in both opposite sides thereof. Each opening is provided with a shutter 44 and an air curtain for isolating the atmosphere in the unit 10 from that in the unit 14.

The number of wafers 22 to be treated at a time in each vessel is not limited to 50 (for the two carries 48), but may be 25 (for one of them), or may be only one, instead of performing batch treatment.

In addition, the invention is applicable also to a washing apparatus for washing LCD substrates or printed boards, or further to a treatment apparatus having a plurality of treatment units for performing continuous treatments, such as an etching apparatus for semiconductor wafers.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A treatment apparatus having a plurality of treatment units for performing batch treatments, for treating a plurality of wafer-like objects in the treatment units while transferring the objects to the units on a continuous basis, the apparatus comprising:
   (a) a loader for supplying objects to be treated;
   (b) a first treatment unit for receiving the objects from the loader, the first treatment unit having
       a first arm having first handling means for receiving and supplying the objects,
       means for rotating the first arm in a horizontal direction,
       first and second treatment sections, the loader, and first and second treatment sections being arranged along a line in which the first handling means rotates, and the objects being transferred between the loader, and first and second treatment sections by means of the first arm;
       first and second support means dedicated to the first and second treatment section, respectively, the support means being formed to receive the objects from the first handling means and support the objects during processing in the first and second treatment sections, and
       first and second driving means dedicated to the first and second treatment sections, respectively, the driving means being formed to move the support means up and down in order to transfer the objects from the first handling means to the support means and from the support means to the first handling means at a transfer position, and to move the support means to a processing position where the objects are processed which is lower than the transfer position;
   (c) an unloader for receiving the objects having been treated;
   (d) a second treatment unit for transferring the objects to the unloader, the second treatment unit having
       a second arm having second handling means for receiving and supplying the objects,
       means for rotating the second arm in a horizontal direction,
       third and fourth treatment sections, the unloader, and third and fourth treatment sections being arranged along a line in which the second handling means rotates, and the objects being transferred between the unloader, and third and fourth treatment sections by means of the second arm;
       third and fourth support means dedicated to the third and fourth treatment sections, respectively, the support means being formed to receive the objects from the second handling means and support the objects during processing in the third and fourth treatment sections, and
       third and fourth driving means dedicated to the third and fourth treatment sections, respectively, the driving means being formed to move the support means up and down in order to transfer the objects from the second handling means to the support means and from the support means to the second handling means at a transfer position, and to move the support means to a processing position where the objects are processed which is lower than the transfer position; and
   (e) a transit section arranged between the first and second treatment units, the transit section having an inlet arranged along the line in which the first handling means rotates, and permitting the objects to be transferred by the first arm, and an outlet arranged along the line in which the second handling means rotates, and permitting the objects to be transferred by the second arm.

2. The apparatus according to claim 1, wherein the transit section comprises a third treatment unit.

3. The apparatus according to claim 1, wherein the apparatus further comprises means for isolating the atmosphere in the first treatment unit from that in the second treatment unit.

4. The apparatus according to claim 1, wherein the loader, first treatment section, second treatment section, and transit section are located around the rotational axis of the first arm such that each adjacent two are arranged at right angles to each other, and the unloader, third treatment section, fourth treatment section, and transit section are located around the rotational axis of the second arm such that each adjacent two are arranged at right angles to each other.

5. A treatment apparatus having a plurality of washing units, for washing a wafer-like objects in the washing units while transferring the object to the units on a continuous basis, the apparatus comprising:
   (a) a loader for supplying an object to be washed;
   (b) a first washing unit for receiving the object from the loader, the first washing unit having
       a first arm having first handling means for receiving and supplying the object,
       means for rotating the first arm in a horizontal direction,
       first and second washing sections, the loader, and first and second washing sections being arranged along a line in which the first handling means rotates, and the object being transferred between the loader, and first and second washing sections by means of the first arm;
       first and second support means dedicated to the first and second washing sections, respectively, the support means being formed to receive the object from the first handling means and support the object during processing in the first and second washing sections, and
       first and second driving means dedicated to the first and second washing sections, respectively, the driving means being formed to move the support means up and down in order to transfer the object from the first handling means to the support means and from the support means to the first handling means at a transfer position, and to move the support means to a processing position where the object is processed which is lower than the transfer position,
   (c) an unloader for receiving the object having been washed;
   (d) a second washing unit for transferring the object to the unloader, the second washing unit having
       a second arm having second handling means for receiving and supplying the object,
       means for rotating the second arm in a horizontal direction,
       third and fourth washing sections,
       the unloader, and third and fourth washing sections being arranged along a line in which the second handling means rotates, and the object being transferred between the unloader, and third and fourth washing sections by means of the second arm; and third and fourth support means dedicated to the third and fourth washing sections, respectively, the support means being formed to receive the object from the second handling means and support the object during processing in the third and fourth washing sections, and third and fourth driving means dedicated to the third and fourth washing sections, respectively, the driving means being formed to move the support means up and down in order to transfer the object from the second handling means to the support means and from the support means to the second handling means at a transfer position, and to move the support means to a processing position where the object is processed which is lower than the transfer position; and (e) a transit section arranged between the first and second washing units, the transit section having an inlet arranged along the line in which the first handling means rotates, and permitting the object to be transferred by the first arm, and an outlet arranged along the line in which the second handling means rotates, and permitting the object to be transferred by the second arm.

6. The apparatus according to claim 5, wherein the transfer section comprises a third washing unit.

7. The apparatus according to claim 5, wherein the apparatus further comprises means for isolating the atmosphere in the first washing unit from that in the second washing unit.

8. The apparatus according to claim 5, wherein the loader, first washing section, second washing section, and transit section are located around the rotational axis of the first arm such that each adjacent two are arranged at right angles to each other, and the unloader, third washing section, fourth washing section, and transit section are located around the rotational axis of the second arm such that each adjacent two are arranged at right angles to each other.

9. The apparatus according to claim 5, wherein each of the first through fourth washing sections has a case provided with an opening for passing the object therethrough, and a treatment vessel arranged in the case, the opening being provided with closing means for isolating the atmosphere in the case from the outside thereof.

10. The apparatus according to claim 9, wherein the closing means comprises a shutter and an air curtain.

11. The apparatus according to claim 9, wherein pressure in the case is kept under vacuum.

12. The apparatus according to claim 9, wherein a washing liquid is contained in the treatment vessel of each of the first through third washing sections.

13. The apparatus according to claim 5, wherein the transit section comprises an underwater loader.

14. The apparatus according to claim 13, wherein the underwater loader comprises a case having openings for passing the object therethrough, a vessel arranged in the case, and isolation means for isolating the atmosphere in the first washing unit from that in the second washing unit.

15. The apparatus according to claim 14, wherein each of the openings is provided with closing means for isolating the atmosphere in the case from the outside thereof.

16. The apparatus according to claim 14, wherein the closing means comprises a shutter and an air curtain.

17. The apparatus according to claim 14, wherein pressure in the case is kept under vacuum.

18. The apparatus according to claim 14, wherein the isolation means comprises a partition plate arranged above the vessel in the case.

19. The apparatus according to claim 5, wherein the transit section comprises a water rinse section having a case, the case having openings for passing the object therethrough, and a vessel arranged in the case, each of the openings being provided with closing means for isolating the atmosphere in the case from the outside thereof.

20. The apparatus according to claim 19, wherein the closing means comprises a shutter and an air curtain.

21. The apparatus according to claim 19, wherein pressure in the case is kept under vacuum.

22. The apparatus according to claim 5, wherein a plurality of the objects are simultaneously subjected to treatments in the washing sections, respectively.

23. The apparatus according to claim 5, wherein only the object is transferred between each pair of adjacent washing sections.

24. The apparatus according to claim 1, wherein each of the support means is provided with a fork having grooves for holding the objects such that the objects are spaced from one another at predetermined intervals, and each of the handling means is provided with a fork having grooves for holding the objects such that the objects are spaced from one another at the same time intervals as the predetermined intervals, and wherein transfer of the objects between the handling means and support means is performed by moving the support means up and down while the forks face and engage with each other.

25. The apparatus according to claim 5, wherein each of the support means is provided with a fork having grooves for holding the objects such that the objects are spaced from one another at predetermined intervals, and each of the handling means is provided with a fork having grooves for holding the objects such that the objects are spaced from one another at the same intervals as the predetermined intervals, and wherein transfer of the objects between the handling means and support means is performed by moving the support means up and down while the forks face and engage with each other.

* * * * *